(12) United States Patent
Ahl et al.

(10) Patent No.: US 6,181,006 B1
(45) Date of Patent: *Jan. 30, 2001

(54) THERMALLY CONDUCTIVE MOUNTING ARRANGEMENT FOR SECURING AN INTEGRATED CIRCUIT PACKAGE TO A HEAT SINK

(75) Inventors: Bengt Ahl, Gavle (SE); Larry C. Leighton, Scottsdale, AZ (US); Thomas W. Moller, Gilroy, CA (US)

(73) Assignee: Ericsson Inc., Morgan Hill, CA (US)

( * ) Notice: Under 35 U.S.C. 154(b), the term of this patent shall be extended for 0 days.

This patent is subject to a terminal disclaimer.

(21) Appl. No.: 09/086,667

(22) Filed: May 28, 1998

(51) Int. Cl.[7] ............................................ H01L 23/34
(52) U.S. Cl. .................... 257/712; 257/713; 257/727; 257/731
(58) Field of Search ................................ 257/727, 731, 257/712, 713

(56) References Cited

U.S. PATENT DOCUMENTS

| | | | |
|---|---|---|---|
| 3,982,271 | 9/1976 | Olivieri et al. | 357/81 |
| 4,907,124 | 3/1990 | Kaufman | 361/386 |
| 5,296,739 | 3/1994 | Heilbronner et al. | 257/687 |
| 5,869,897 | * 2/1999 | Leighton et al. | 257/727 |

FOREIGN PATENT DOCUMENTS

| | | | |
|---|---|---|---|
| 0421599 | 4/1991 | (EP) | H01L/23/057 |
| 55-061047 | * 8/1980 | (JP) | |
| 06338577 | 6/1994 | (JP) | H01L/23/40 |

* cited by examiner

Primary Examiner—Roy Potter
(74) Attorney, Agent, or Firm—Lyon & Lyon LLP

(57) ABSTRACT

An electrical assembly includes an IC package having a thermally conductive mounting flange in contact with a heat sink. A thermally conductive casing is secured to the heat sink, the casing at least partially enclosing the IC package. A resilient retaining member is disposed between the casing and IC package, the retaining member applying sufficient force on the IC package so as to maintain good thermal contact between the mounting flange and heat sink.

16 Claims, 3 Drawing Sheets

THERMALLY CONDUCTIVE MOUNTING ARRANGEMENT FOR SECURING AN INTEGRATED CIRCUIT PACKAGE TO A HEAT SINK

FIELD OF THE INVENTION

The present invention pertains to the field of integrated circuit packages and, in particular, to mounting arrangements for securing an integrated circuit package to a heat sink.

BACKGROUND

Integrated circuits ("ICs") have many uses in industries ranging from communications to consumer electronics. By way of example, a power transistor IC is formed by fabricating one or more transistor cells on a silicon wafer, commonly referred to as a transistor "chip". The transistor chip is attached to an isolating layer, normally a ceramic substrate, which is thermally, but not electrically, conductive. The ceramic substrate is itself attached to a thermally conductive mounting flange. A protective cover is secured to the flange, covering the substrate and transistor chip, thereby forming a power transistor IC "package."

Various electrically conductive (e.g., thin metal) leads may be attached to, and extend away from the package, in order to connect common terminals of the transistor chip to other circuit elements located, e.g., on an adjacent printed circuit ("PC") board. For example, with a bipolar junction type power transistor, respective electrical leads attached to the package are connected to a base, emitter and collector of the transistor chip.

Because the power transistor package generates a significant amount of heat during operation, the bottom surface of the package mounting flange is normally directly secured to a metallic heat sink underlying the PC board. For example, a single layer PC board has a layer of dielectric material between respective top and bottom conductive surfaces, wherein the bottom surface acts as a reference ground. This bottom surface is connected, usually with screws or solder, to the underlying metal heat sink, so that the bottom surface and the heat sink have the same ground potential with respect to any circuit elements attached to the top surface of the PC board.

There are several known techniques for securing an IC package to a heat sink surface. For example, as illustrated in FIG. 1, an exemplary IC package 20 may be secured to a heat sink 22 by a solder connection 28 between the bottom surface of the package mounting flange 26 and the surface of the heat sink 22.

While this approach is relatively simple, the solder weld material 28 will invariably have a different thermal expansion coefficient than the respective (typically metal) mounting flange 26 and heat sink 22. As a result, the bond between the mounting flange 26 and heat sink 22 will weaken or even be destroyed by the thermal expansion stress between the respective layers, especially when subjected to repeated changes in temperature during each use of the IC package 20. Further, the presence of the intervening bonding material layer 28 may lesson the effectiveness of the heat conduction between the flange 26 and heat sink 22. A still further disadvantage with this approach is that, in order to remove the IC package 20 for repair or replacement, the entire heat sink 22 must be heated to break the solder bond 28, thereby causing any other solder bonds on the same heat sink 22 to be weakened.

Referring to FIG. 2, as an alternative to using a solder connection, the IC package 20 may be secured to the heat sink 22 with a pair of screws 24 through openings located on respective ends of the mounting flange 26. Referring to FIGS. 3 and 4, still another technique for securing an IC package to a heat sink is to insert one or more screws 30 into, so as to be protruding above, the surface of the heat sink 22. A resilient metal strip 32 is extended from the screw(s) 30 and is shaped so as to apply a clamping force upon the cover of the IC package 20, thereby distributing a substantially centered force that "secures" the mounting flange 26 against the heat sink 22.

Still another method for securing an IC package to a heat sink is disclosed and described in pending U.S. patent application Ser. No. 08/956,193, entitled, "Mounting Arrangement For Securing An Integrated Circuit Package To A Heat Sink," which is fully incorporated herein by reference for all it teaches. As taught therein, and as illustrated in FIG. 5, a top surface 52 of a protective cover 50 of an IC component package 40 is provided with a centered-protrusion 54. A resilient retaining-spring 46 formed into a ribbon-like shape having opposing ends 56 and 58 that extend from a curvelinear bottom surface 60 is provided with an opening 62 sized to mate with the centered protrusion 54.

To mount the IC package 40 to a heat sink 42, the retaining-spring opening 62 is compressively mated onto the package cover protrusion 54 as the mounting flange 45 of the IC package 40 is inserted between substantially parallel walls 44 and 48 protruding from the heat sink 42, such that the opposing retaining-spring ends 56 and 58 extend away from the package cover 50 at substantially the same, albeit reverse angles. The walls 44 and 48 are distanced from each other just so as to cause moderate compression of the opposing retaining-spring ends 56 and 58 toward each other as the flange 45 is inserted against the heat sink 42.

The walls 44 and 48 are each provided with a respective plurality of notches 64 and 68, which extend substantially parallel to the heat sink 42 in a "ratchet-type" relief pattern. Once the mounting flange 45 is pressed against the heat sink 42, the opposing spring ends 56 and 58 are retained in place by the respective wall notches 64 and 68. In this manner, the spring 46 applies a retaining force against the package cover 50, thereby securing the mounting flange 45 against the heat sink 42, as indicated by the arrow 70.

With any of the above-illustrated methods for securing an IC package to a heat sink, once the IC package is secured to the heat sink, electrical leads extending from the package (not shown in FIGS. 1–5) must be connected to respective conductive surface leads or areas, e.g., located on an adjacent PC board attached to the heat sink.

By way of illustration, referring to FIG. 6, the mounting flange 86 of an IC package 80 is mounted on a heat sink 82 via a conventional solder weld 84. A single layer PC board 88 is also secured to the heat sink 82, e.g., by screws (not shown) adjacent both sides of the package 80. The PC board includes a metal top surface 90, a layer of dielectric material 92, and a metal bottom surface 94, respectively, wherein the bottom surface 94 and attached heat sink 82 collectively act as a reference ground with respect to circuit elements (not shown) attached to the top surface of the PC board 88. Respective leads 96 and 98 extend from opposite sides of the package 80 and are connected to corresponding conductive paths formed on the top surface 90 of the PC board 88 via respective solder welds 100 and 102.

As with the problems of using a solder weld connection between the respective package flange (28) and heat sink (22) described above in conjunction with FIG. 1, the solder weld connections 100 and 102 are also prone to problems caused by different thermal expansion coefficients between the solder material, the conductive surface 90, and the respective (metal) leads 96 and 98. In particular, the solder material can crystallize after repeated heating and cooling, causing welds 100 and 102 to weaken and/or fail, with the respective leads 96 and 98 lifting and separating from the surface 90 of the PC board 88.

Thus, it would be desirable to provide improved arrangements for securing an IC component package to a heat sink, whereby solder-welds are eliminated.

Further, it is desirable to provide for as much thermal conduction of heat from the respective IC package and electrical leads to the heat sink as possible.

SUMMARY OF THE INVENTION

The present invention provides improved arrangements for securing an IC component package to a heat sink in a manner which provides for the non-solder-based connection of leads extending from the package to respective conductive pathways located on an adjacent PC board surface, as well as improved thermal conduction of heat from the package to the heat sink.

In a preferred embodiment, an electrical circuit assembly includes an IC package having a thermally conductive mounting flange in contact with a heat sink. The IC package includes a first lead frame attached to, and extending away from, a first side of the IC package, and a second lead frame attached to, and extending away from, a second side of the IC package. A first conductive surface is attached to the heat sink adjacent the first side of the IC package, and a second conductive surface attached to the heat sink adjacent the second side of the IC package.

A thermally conductive casing is secured to the heat sink by first and second screws, wherein the first screw electrically couples the first lead frame to the first conductive surface, and the second screw electrically couples the second lead frame to the second conductive surface. In particular, a first screw is fastened through the casing and first lead frame into the heat sink, with a first isolating washer placed between the casing and first lead frame to electrically isolate the two components from each other. A second screw is fastened through the casing and second lead frame into the heat sink, with a second isolating washer placed between the casing and second lead frame to electrically isolate the two components from each other.

The first and second screws are sufficiently tightened against the casing/isolating washers so as to press the respective lead frames into solid electrical contact with the conductive surfaces. Portions of the respective lead frames and conductive surfaces surrounding the respective tie-down screws are cut-away in order to avoid shorting the lead frames and/or conductive surfaces to the heat sink via the tie-down screws.

In accordance with a further aspect of the present invention, a resilient retaining member is disposed between the casing and IC package, the retaining member applying sufficient force on the IC package so as to maintain good thermal contact between the mounting flange and heat sink, such that a traditional solder connection is not required.

As will be apparent to those skilled in the art, other and further objects and advantages of the present invention will appear hereinafter.

BRIEF DESCRIPTION OF THE DRAWINGS

The drawings illustrate both the design and utility of the present invention, in which similar elements in different embodiments are referred to by the same reference numbers for purposes of ease in illustration, in which.

DETAILED DESCRIPTION OF THE PREFERRED EMBODIMENTS

Figure 1:
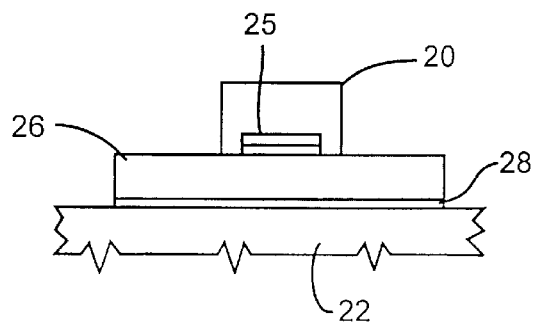
FIG. 1 is a side view of a first prior art mounting arrangement, wherein an IC package is soldered or otherwise bonded to a heat sink.
Figure 2:
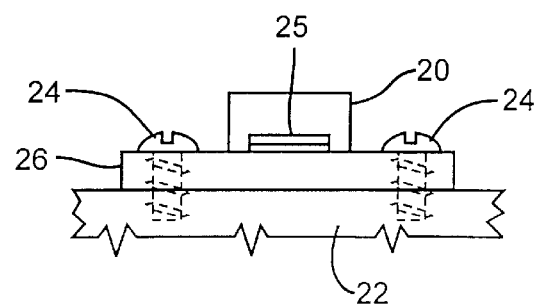
FIG. 2 is a partial cut-away side view of a second prior art mounting arrangement, wherein mounting screws are employed for directly attaching an IC package to a heat sink.
Figure 3:
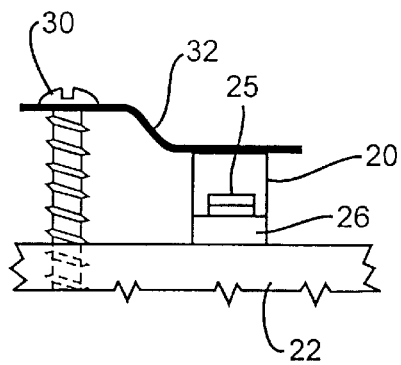
FIG. 3 is a side view of a third prior art mounting arrangement, wherein a single retaining screw and retaining strip extending therefrom are used to secure an IC package to a heat sink.
Figure 4:
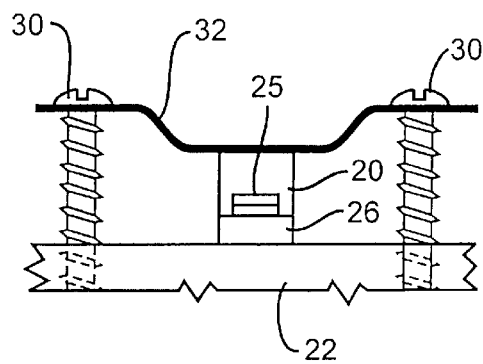
FIG. 4 is an side view of a fourth prior art mounting arrangement, wherein a pair of retaining screws and a retaining strip extended therebetween are used to secure an IC package to a heat sink.
Figure 5:
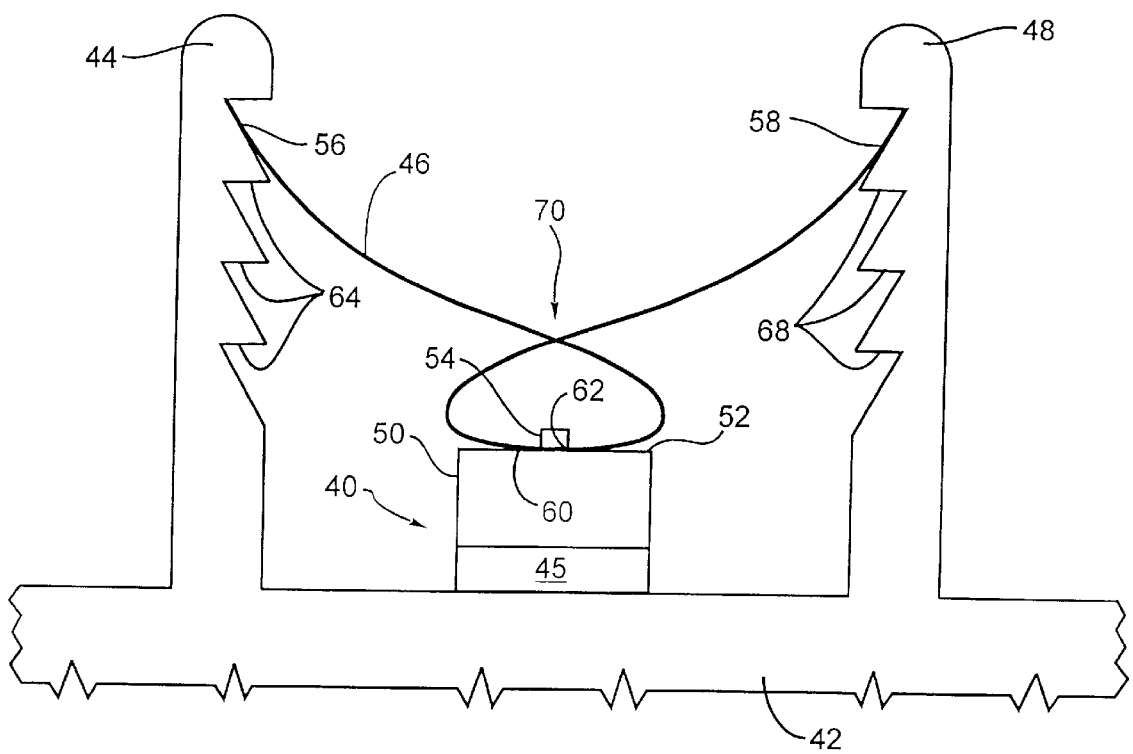
FIG. 5 is a partial cut-away side view of a still further arrangement for mounting an IC package to a heat sink, wherein a resilient, ribbon-shaped retaining-spring is affixed to the center of a protective cover of the package and held in place by a pair of opposing walls protruding from the heat sink.
Figure 6:
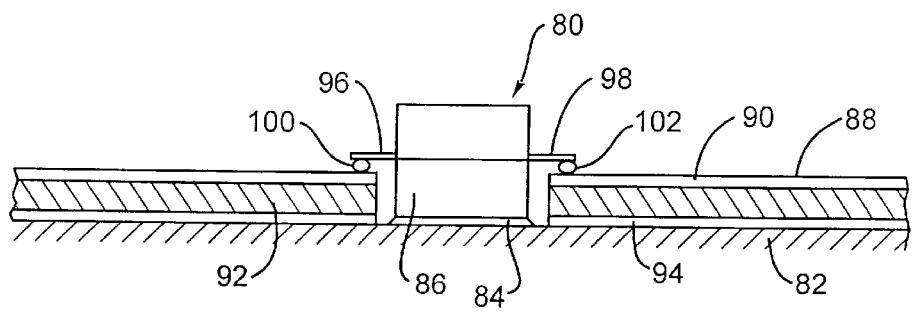
FIG. 6 is a partial cut-away side view of an IC package solder bonded to a heat sink, whereby conductive surface leads on an adjacent PC board are connected to respective leads extending from the package via a prior art solder weld connections.
Figure 7:
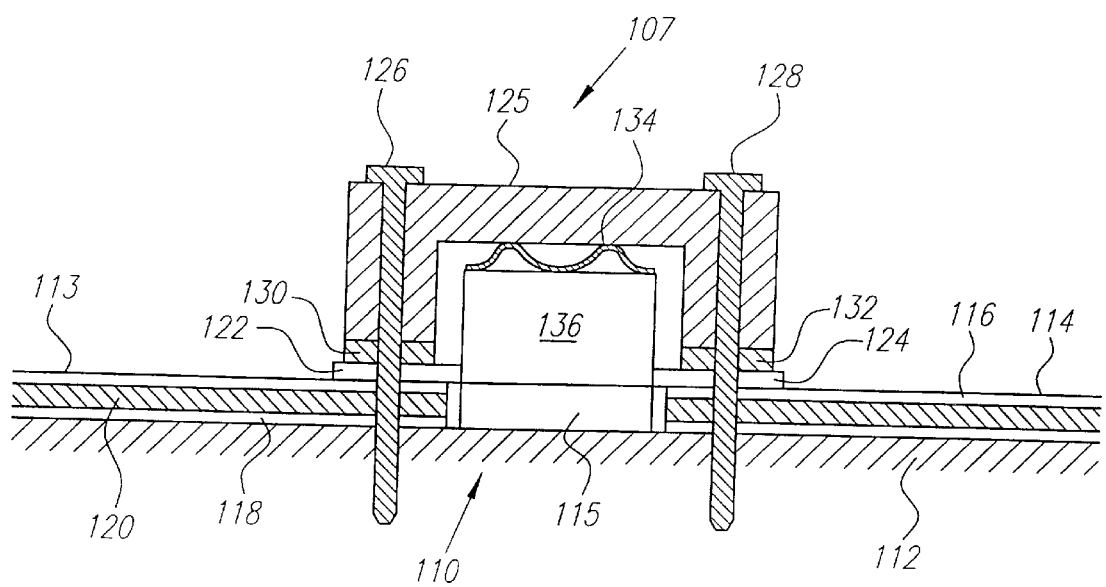
FIG. 7 is a partially cut-away side view of a preferred electrical assembly in accordance with the present invention, wherein a IC transistor package is mounted on a heat sink via a pair of tie-down screws threaded through a thermally conductive casing, which substantially encloses the transistor package.
Figure 8:
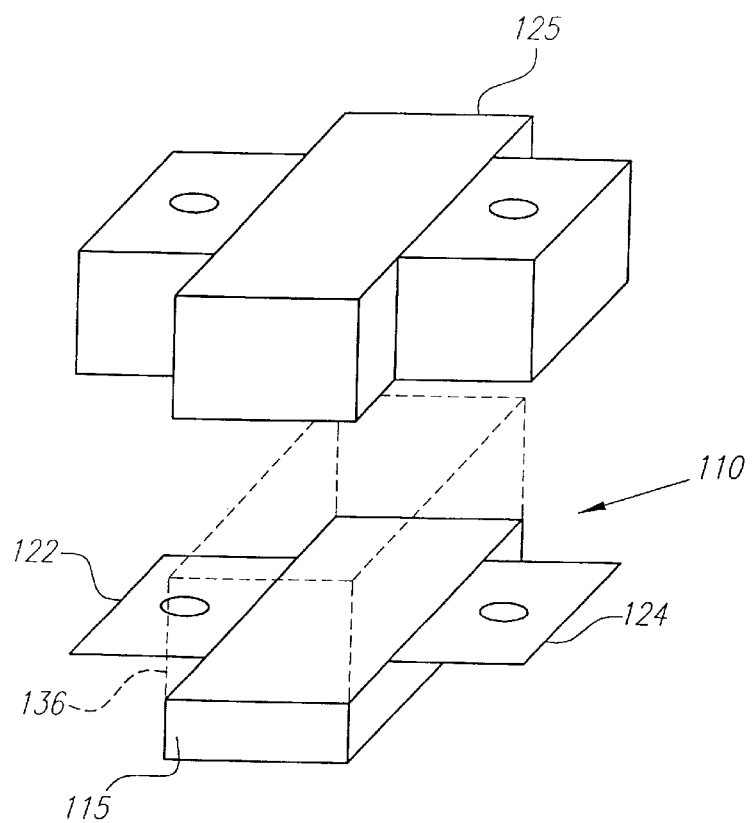
FIG. 8 is a perspective view of a the transistor package and thermally conductive casing of the assembly in FIG. 7, with the casing shown lifted away from the transistor package for purposes of illustration.

Referring to FIGS. 7 and 8, as part of a preferred electrical assembly 107, a mounting flange 115 underlying a power transistor package 110 is positioned on a heat sink 112 between first and second sections 113 and 1.14 of single layer PC board attached to the heat sink 112. The respective PC board sections 113 and 114 each comprise a conductive metal top surface 116, a middle layer of dielectric material 120, and a conductive metal bottom surface 118, respectively, with the bottom surface 118 and attached heat sink 112 collectively acting as a reference ground with respect to circuit elements (not shown) attached to the conductive top surface 116.

The power transistor package 110 includes a first electrical lead frame 122 extending over the top surface 116 of the first PC board section 113, and a second electrical lead frame 124 extending over the top surface 116 of the second PC board section 114.

A thermally conductive casing 125 substantially encloses the transistor package 110 against the heat sink 112. The casing, which is preferably made of a highly thermally conductive metal, such as copper, absorbs heat generated by the transistor package 110 during operation. The casing 125 is secured to the heat sink 112 by first and second tie down screws 126 and 127.

In particular, the first tie-down screw 126 is fastened through the casing 125, a first dielectric isolating washer 130, the first lead frame 122 and the first PC board section 113, respectively, into the heat sink 112. The second tie-down screw 128 is fastened through a second dielectric isolating washer 132, the second lead frame 124 and the second PC board section 114, respectively, into the heat sink 112. The screws 126 and 128 are preferably sufficiently tightened against the isolating washers 130 and 132 so that washers press the respective lead frames 122 and 124 into solid electrical contact with the conductive top surface 116 of the respective PC board sections 113 and 114.

The lead frames 122 and 124 and the conductive top surface 116 of the PC board sections 113 and 114 surrounding the respective screws 126 and 128 are cut-away to prevent electrical contact in order to avoid shorting the leads 122/124 and/or the conductive top surface 116 to the heat sink 112 via the screws 126/128. The isolating washers 130 and 132 are preferably made of a good thermal conductor in order to allow for heat from the lead frames 122 and 124 to dissipate into the casing 125 via the respective screws 126 and 128. Examples of such materials include dielectrics like beryllium oxide and aluminum nitride.

An advantage of the package lead connection employed in assembly 107 is that solder connections between the respective lead frames 122 and 124 and the conductive surface 116 of the PC board sections 113 and 114 are eliminated, thereby decreasing thermal stresses and strains on the leads.

A further advantage is that the dielectric isolating washers 130 and 132, in conjunction with the respective casing 125 and package lead frames 122/124, provide a pair of capacitors to help match the impedance between the lead frames 122/124 and the respective conductive surface 116 areas. Notably, depending on the stiffness of the dielectric isolating washers 130/132, the screws 126 and 128 could each act as a trimmer to adjust the capacitance of the respective washers 130/132—i.e., by the relative tightening of the respective screw(s).

A still further advantage is that the thermally conductive casing 125 facilitates improved thermal conduction of heat from the transistor package 110 to the heat sink 112 via the screws 126 and 128, which are also preferably made of a highly thermally conductive material, such as copper.

In accordance with a further aspect of the present invention, a resilient retaining member 134 is disposed between the casing 125 and a cover 136 of the transistor package 110. In particular, the retaining member 134 applies sufficient force on the transistor package 110 so as to maintain good thermal contact between the mounting flange 115 and heat sink 112, such that a traditional solder connection between the two components is not required.

Thus, preferred embodiments have been disclosed of an improved mounting arrangement for securing a IC package to a heat sink. While embodiments and applications of this invention have been shown and described, as would be apparent to those skilled in the art, many more modifications and applications are possible without departing from the inventive concepts herein.

The scope of the invention, therefore, are not to be restricted except in the spirit of the appended claims.

What is claimed is:

1. An electrical assembly, comprising:
   a heat sink;
   an integrated circuit (IC) package, the IC package including a thermally conductive mounting flange having a bottom surface in contact with the heat sink and a top surface, an integrated circuit (IC) device attached to the top surface of the mounting flange, and a cover attached to the top surface of the mounting flange, the cover substantially enclosing the IC device;
   a thermally conductive casing secured to the heat sink, the casing at least partially enclosing the IC package; and
   a retaining member disposed between the casing and IC package, the retaining member applying sufficient force on the IC package so as to maintain good thermal contact between the mounting flange and heat sink.

2. The electrical assembly of claim 1,
   the assembly further comprising a conductive surface attached to the heat sink adjacent the IC package,
   the IC package further including an attached lead frame extending away from the package,
   wherein the casing is secured to the heat sink by means which also electrical couples the lead frame to the conductive surface.

3. The electrical assembly of claim 2, wherein the conductive surface comprises a single layer PC board.

4. The electrical assembly of claim 2, wherein the means for securing the casing to the heat sink comprise a screw.

5. The electrical assembly of claim 4, wherein the screw is secured to the heat sink through a portion of the lead frame.

6. The electrical assembly of claim 5, wherein a portion of lead frame surrounding the screw is cut-away to prevent electrical contact between the lead frame and screw.

7. The electrical assembly of claim 2, wherein the casing is electrically isolated from the lead frame.

8. The electrical assembly of claim 1, wherein the retaining member comprises a resilient metal piece.

9. An electrical assembly, comprising:
   a heat sink;
   an integrated circuit (IC) package including a thermally conductive mounting flange in contact with the heat sink, the IC package also including a lead frame extending away from the IC package;
   a conductive surface attached to the heat sink adjacent the IC package; and
   a thermally conductive casing secured to the heat sink, the casing at least partially enclosing the IC package,
   wherein the casing is secured to the heat sink in a manner which also electrical couples the lead frame to the conductive surface.

10. An electrical circuit assembly, comprising:
    a heat sink;
    an integrated circuit (IC) package including a thermally conductive mounting flange in contact with the heat sink, the IC package also including
      a first lead frame attached to, and extending away from, a first side of the IC package, and
      a second lead frame attached to, and extending away from, a second side of the IC package;
    a first conductive surface attached to the heat sink adjacent the first side of the IC package;
    a second conductive surface attached to the heat sink adjacent the second side of the IC package; and
    a thermally conductive casing secured to the heat sink by first and second screws,
    wherein the first screw electrically couples the first lead frame to the first conductive surface, and the second screw electrically couples the second lead frame to the second conductive surface.

11. The electrical assembly of claim 10, further comprising a retaining member disposed between the casing and IC package, the retaining member applying sufficient force on the IC package so as to maintain good thermal contact between the respective mounting flange and heat sink.

12. The electrical assembly of claim 11, wherein the retaining member comprises a resilient metal piece.

13. The electrical assembly of claim 10, wherein the first and second conductive surfaces each comprise a single layer PC board.

14. The electrical assembly of claim 10, further comprising first isolation means disposed between the first screw and the first lead frame, and second isolation means disposed between the second screw and the second lead frame.

15. The electrical assembly of claim 14, wherein the first and second isolation means comprise respective first and second dielectric washers, and wherein the first screw is secured to the heat sink through the respective casing and first lead frame, with the first washer disposed between the casing and first lead frame, and.

the second screw is secured to the heat sink through the respective casing and second lead frame, with the second washer disposed between the casing and second lead frame.

16. The electrical assembly of claim 10, wherein a portion of the first lead frame is cut-away to prevent electrical contact between the first lead frame and first screw, and a portion of the second lead frame is cut-away to prevent electrical contact between the second lead frame and second screw.

* * * * *